United States Patent [19]

Neukermans et al.

[11] Patent Number: 4,608,326

[45] Date of Patent: Aug. 26, 1986

[54] SILICON CARBIDE FILM FOR X-RAY MASKS AND VACUUM WINDOWS

[75] Inventors: Armand P. Neukermans, Palo Alto; Kuo L. Chiang, Los Altos; Frederic N. Schwettmann, San Jose; Donald R. Bradbury, Palo Alto, all of Calif.

[73] Assignee: Hewlett-Packard Company, Palo Alto, Calif.

[21] Appl. No.: 804,331

[22] Filed: Dec. 4, 1985

Related U.S. Application Data

[63] Continuation of Ser. No. 579,640, Feb. 13, 1984, abandoned.

[51] Int. Cl.$^4$ ............................................. G03F 9/00
[52] U.S. Cl. ............................................. 430/5; 430/966; 428/698; 378/35
[58] Field of Search .................... 430/5, 321, 966, 967; 378/34, 35; 427/419.7; 428/698

[56] References Cited

U.S. PATENT DOCUMENTS

| 4,253,029 | 2/1981 | Lepselter et al. | 250/505 |
| 4,436,797 | 3/1984 | Brady et al. | 430/5 |
| 4,451,544 | 5/1984 | Kawabuchi | 430/5 |

FOREIGN PATENT DOCUMENTS

| 56-069632 | 6/1981 | Japan | 430/5 |
| 58-14837 | 1/1983 | Japan | 430/5 |

OTHER PUBLICATIONS

Bassous et al., "High Transmission X-Ray Mask for Lithographic Applications," IBM Tech. Disclosure Bulletin, vol. 18, No. 12, May 1976, pp. 4210–4211.

Primary Examiner—John Kittle
Assistant Examiner—José G. Dees
Attorney, Agent, or Firm—Jeffery B. Fromm

[57] ABSTRACT

A layered structure for use in an X-ray membrane (pellicle) mask or a vacuum window is provided in which an intermediate amorphous layer such as silicon dioxide is grown on a silicon substrate which provides a stress relief medium and surface properties which enhance and improve subsequent process layers by breaking the epitaxial nature of these later deposited layers. Upon subsequent deposition of an inorganic overcoat, such as SiC, on the intermediate amorphous layer, the overcoat produces a nearly defect-free layer with a substantially reduced stress of suitable quality for X-ray lithography mask fabrication. Furthermore, additional alternating layers of a silicon carbide film and an intermediate inorganic layer, such as silicon nitride, can be deposited to obtain an even smoother silicon carbide surface and stronger structure.

8 Claims, 4 Drawing Figures

SILICON CARBIDE FILM FOR X-RAY MASKS AND VACUUM WINDOWS

CROSS REFERENCE TO RELATED APPLICATION

This application is a continuation of application Ser. No. 579,640, filed Feb. 13, 1984, now abandoned.

BACKGROUND OF THE INVENTION

This invention relates to a method of making and a structure for smooth silicon carbide films and particularly to silicon carbide films used in X-ray masks and vacuum windows.

The X-ray mask is a critical structure in X-ray lithographic proximity printing. In general, X-rays from a point source of soft X-rays are shadowed by a heavy element mask consisting of a pattern absorber layer supported on a flat membrane, or pellicle, which is relatively transparent to the radiation. At the present time, the pellicle supporting the pattern absorber layer is made of a thin, inorganic material which minimizes X-ray attenuation, and yet remains mechanically stable to minimize distortion caused by stresses in the patterned absorber layer. Typically the pellicle is stretched across a stiff, flat ring whose expansion coefficient closely matches that of silicon. This stretching process flattens the substrate and stiffens it against bending and breaking. Factors important to mask fabrication are dimensional stability, absorber line-edge profile, and defect density. Also X-ray mask fabrication requires many steps which are similar to those used in wafer processing. As in wafer processing, these processing steps contribute to the defect density in the X-ray mask. Hence, defect density remains a highly critical problem.

Presently available pellicles are fabricated by the deposition of sequential layers of boron nitride and polyimide onto a sacrificial silicon substrate. The boron nitride is generally formed by the reaction of ammonia and diborane in a suitable chemical vapor deposition process. Typically a layer of filtered polyimide is spun on top of the boron nitride from a liquid source in order to cover small defects. However, many defects still remain at the polyimide surface.

In addition to boron nitride, silicon carbide has recently been deposited by chemical vapor deposition (CVD) onto silicon to form X-ray pellicles. This film is chemically inert and has excellent mechanical stability and strength, much stronger than boron nitride. Furthermore, the coefficient of expansion of silicon carbide can be closely matched to that of silicon. It is these properties of silicon carbide that make it an ideal mask support material. However, CVD of silicon carbide also has some inherent disadvantages. If the silicon carbide is deposited directly onto the wafer surface, the film tends to have a large number of defects. Also, for direct deposition on silicon, the deposition parameters required for optimum film smoothness do not necessarily coincide with the conditions required for optimum stress in the membrane.

Furthermore, vacuum windows used, for example, in electron beam addressed liquid crystal displays require deposition of a silicon carbide film directly onto a silicon wafer, thus also requiring a smooth silicon carbide surface. Additionally, the silicon carbide film must be thick enough to stop electrons produced from electron beam bombardment and thin enough to have low lateral heat loss. A silicon carbide film typically two microns thick is required to stop electrons in the range of 15 KEV to 20 KEV. However, when deposited to this thickness the surface roughness of the silicon carbide film is increased and correct alignment of the molecules of the liquid crystal on such a rough silicon carbide surface is difficult.

Therefore, to alleviate the present disadvantages of using silicon carbide films for the fabrication of X-ray masks and vacuum windows, a new mask structure has been developed. The present invention presents this structure and a method for its construction.

SUMMARY OF THE INVENTION

In accordance with the illustrated preferred embodiment, the present invention uses an intermediate amorphous layer grown directly onto a silicon wafer prior to deposition of a silicon carbide film. Unlike the pellicle structures of the prior art (which use no intermediate layer), the amorphous structure of this intermediate film breaks the epitaxy of the silicon carbide and allows it to be very fine grained, thus resulting in an extremely smooth surface. The defect density of the pellicle using this particular structure is drastically reduced and the layer becomes acceptable for quality mask and vacuum window fabrication.

DETAILED DESCRIPTION OF THE INVENTION

Figure 1:
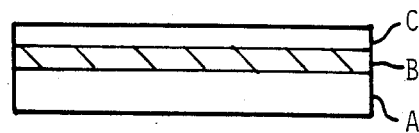
FIG. 1 shows the structure of the preferred embodiment of a layered structure for use in an X-ray mask pellicle.

In FIG. 1 there is shown a cross-section of a layered structure of the preferred embodiment, which can be used in fabricating X-ray masks or other elements requiring very smooth silicon carbide surfaces. In accordance with aspects of the invention, an intermediate amorphous layer B is grown on a silicon substrate A (typically of <100> orientation, although other orientations can be used) and then subsequently deposited with a silicon carbide overcoat C. The thickness and choice of the material used for intermediate amorphous layer B provides the degree of freedom which allows for the improvement in the film properties of the silicon carbide overcoat C. The intermediate amorphous layer B also acts as a stress relief medium between the silicon substrate A and the silicon carbide overcoat C. In the preferred embodiment in which the substrate A is silicon, layer B is typically $SiO_2$ grown to a thickness of about 1000 Angstroms by conventional oxidation techniques, although the thickness can range from as little as 200 to as much as 10,000 Angstroms. The oxide layer B has a thermal coefficient of expansion significantly less than that of silicon substrate A. Hence, to ensure that the silicon substrate is under tension when etched, the silicon carbide is deposited, as will be explained shortly, with a slightly larger expansion coefficient than that of silicon. The preoxidation of the silicon substrate breaks the epitaxial nature of the silicon carbide deposition, thus making it possible to substantially improving the smoothness of the silicon carbide overcoat relative to silicon carbide layers deposited directly on the silicon. Other materials which are suitable for intermediate amorphous layer B are silicon nitride, boron nitride, and boron carbide, the thickness ranging from about 100 Angstroms to about 10,000 Angstroms.

The silicon carbide overcoat is deposited by conventional chemical vapor deposition techniques (see, e.g., W. M. Feist, S. R. Steele, and D. W. Ready, "The Preparation of Films by Chemical Vapor Deposition," *Phys- ics of Thin Films,* Vol. 5, (edited by G. Has and R. E. Thun) Academic Press, New York, London (1969) pp. 237–314; J. J. Tietijen, "Chemical Vapor Deposition of Electronic Materials," in: A. Rev. Mater. Sci. 3, (edited by R. A. Huggins, R. H. Sube, and W. Roberts), published by Annual Reviews (1973) pp. 317–326; T. L. Chu and R. K. Smelzer, "Recent Advances in Chemical Vapor Growth of Electronic Materials," *J. Vac. Sci. Technol.* 10, 1(1973)). Typically, a methane line is added to a standard horizontal reactor, and films of silicon carbide are deposited onto the silicon substrate at temperatures of 1000–1150 degrees celsius by reaction with silane. (Other hydrocarbons could, of course, be used. However, the substantial purity of commercially available methane makes it the preferable reactant gas.) The residual stress can be adjusted over a wide range by varying the silane to methane ratio and deposition temperature. In order to obtain an appropriate film for X-ray masks, the ratio of methane to silane is generally kept greater than about 10:1. When deposited on substrates with approximately 1000 Angstroms of thermal oxide, silicon carbide films deposited by the above process are resistant to oxidation, cannot be etched by standard plasma methods, are relatively pinhole free, and exhibit improved transparency and generally good visual quality. Further, silicon carbide films produced by the above process are extremely smooth, and have a mean surface roughness which is reduced by at least 7:1 as compared with silicon carbide deposited directly onto a silicon substrate. Typically, surface smoothnesses as low as 100 Angstroms (root mean square) have been obtained using the above process.

Figure 2:
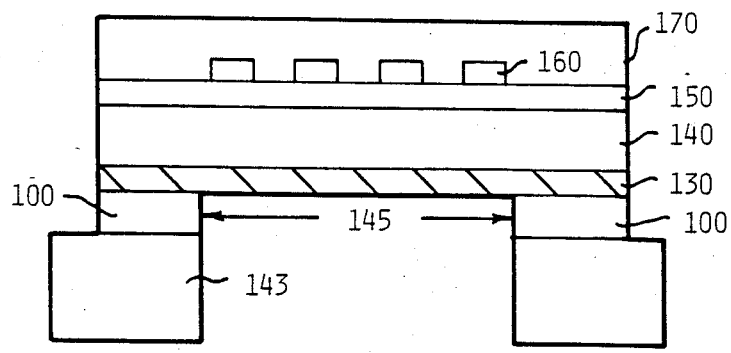
FIG. 2 shows an X-ray mask pellicle according to the invention.

Using the above constructed layered structure, an X-ray mask can then be formed in a manner similar to conventional techniques used for boron nitride X-ray masks. For example, a typical process for preparing a silicon carbide X-ray mask structure is shown in FIG. 2. On a top surface of a silicon substrate 100, a padding layer 130 is formed, typically consisting of either a silicon dioxide ($SiO_2$) or silicon nitride ($Si_3N_4$) film using chemical vapor deposited (CVD) techniques. A CVD layer of silicon carbide 140 is then formed over padding layer 130. The thickness of padding layer 130 is customarily about 1,500 Angstroms and the silicon carbide layer 140 is usually in the range of 10,000 to 30,000 Angstroms. Support plates 143 are bonded to selected portions of a bottom surface of silicon substrate 100 using conventional methods. Typically, masking plates known under the tradename of "Pyrex" are used. Then the silicon substrate 100 is removed in region 145 using wet etching techniques. Silicon carbide (SiC) layer 140 is overlaid with a polyimide layer 150 using conventional methods, such as spinning and metal layer 160 is formed over polyimide layer 150. Typically metal layer 160 is made of gold or a gold alloy and is formed either by evaporation or sputtering techniques. Desired patterned features are formed in metal layer 160 by electron beam techniques, leaving surface portions of polyimide layer 150 exposed. An overcoat layer 170 made from polyimide is formed by means of spinning over the now patterned metal layer 160 and exposed surface portions of polyimide layer 150. Overcoat layer 170 is primarily a protective coating.

Figure 3:
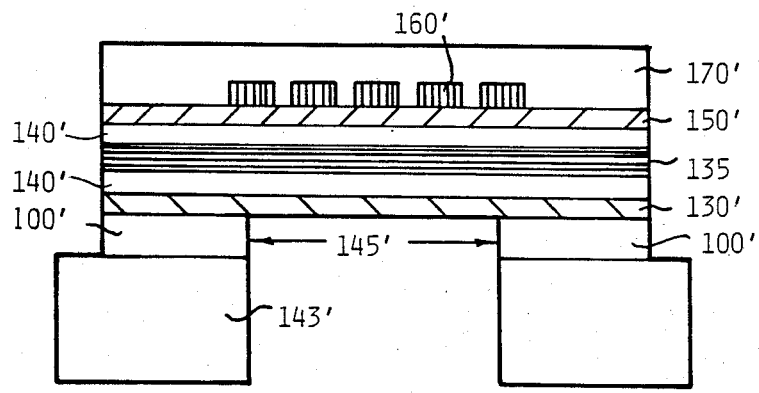
FIG. 3 shows the structure of a second embodiment of a layered structure for use in an X-ray mask pellicle.

In FIG. 3 there is shown a cross-section of a layered structure of a second embodiment, which can be used in fabricating an X-ray mask. By depositing additional alternating layers of an intermediate inorganic layer 135 and silicon carbide layer 140' over padding layer 130' an even smoother silicon carbide surface can be obtained. Structures with five or seven alternating layers show dramatic improvement in silicon carbide film surface smoothness. The use of an intermediate inorganic layer between successive silicon carbide layers terminates the epitaxial growth of the silicon carbide layer deposited on the intermediate inorganic layer. For best results, intermediate inorganic layer 135 is made of silicon nitride typically deposited by CVD to a thickness of about 1000 Angstroms, although the thickness can range from as little as 200 Angstroms to as much as 0.35 micron. Other materials which are suitable for intermediate inorganic layer 135 are silicon dioxide, boron nitride, and boron carbide, the thickness ranging from about 500 Angstroms to about 3500 Angstroms. Support plates 143' are then bonded to selected portions of a bottom surface of silicon substrate 100' using conventional methods. Then the silicon substrate 100' is removed in region 145' using wet etching techniques. Silicon carbide layer 140' is overlaid with a polyimide layer 150' using conventional methods, such as spinning and subsequently patterned by electron beam techniques to produce patterned layer 160', leaving surface portions of polyimide layer 150' exposed. An overcoat layer 170' of polyimide is formed by means of spinning over the now patterned metal layer 160' and exposed surface portions of polyimide layer 150'.

Layered silicon carbide films deposited by the above process are stronger than conventional boron nitride films, show significantly reduced crack propagation at the grain boundaries, and are extremely smooth. As a result, they are also especially good for vacuum windows, which require these properties. The SiC has a mean surface roughness which is reduced by at least 7:1 as compared with single SiC films deposited directly onto a Si substrate. Layered SiC structures with more alternating layers (e.g., 5 or 7 alternating silicon carbide and silicon nitride layers) show further enhanced surface smoothness.

Figure 4:
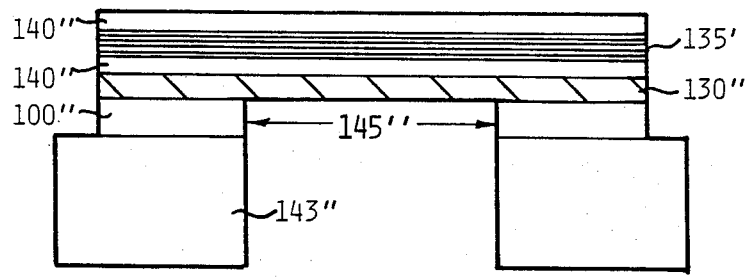
FIG. 4 shows a layered window structure according to the invention for use in a vacuum system.

FIG. 4 shows a layered window structure for use in a vacuum system. This structure can be formed in a manner similar to the methods used for preparing a layered silicon carbide X-ray mask. Support plates 143" are bonded to selected portions of a bottom surface of silicon substrate 100" and a silicon nitride layer 130" is deposited over silicon substrate 100". Silicon substrate 100" is removed over region 145" using wet etching techniques. Silicon nitride layer 130" is overlaid with a silicon carbide layer 140" and an intermediate layer of silicon nitride layer 135' is then deposited over silicon carbide layer 140". A silicon carbide layer 140" is then deposited over silicon nitride layer 135'.

What is claimed is:

1. An X-ray mask structure comprising:
    a substrate;
    a first intermediate amorphous layer composed substantially of an inorganic material over said substrate;

a first inorganic layer composed substantially of SiC over said first intermediate amorphous layer, so that the first intermediate amorphous layer breaks the epitaxy between the substrate and the first inorganic layer;

a second intermediate amorphous layer composed substantially of an inorganic material over said first inorganic layer;

a second inorganic layer composed substantially of SiC over said second intermediate amorphous layer, the second intermediate amorphous layer breaking the epitaxy between the first inorganic layer and the second inorganic layer; and a patterned layer of X-ray absorbing material over said second inorganic layer.

2. An X-ray mask structure as in claim 1 wherein said first intermediate amorphous layer is selected from the group consisting essentially of silicon dioxide, silicon nitride, boron nitride and boron carbide.

3. An X-ray mask structure as in claim 1 wherein said second intermediate amorphous layer is selected from the group consisting essentially of silicon dioxide, silicon nitride, boron nitride and boron carbide.

4. An X-ray mask structure as in claim 1 wherein said first and second inorganic layers and said first and second intermediate amorphous layers are formed by chemical vapor deposition.

5. An X-ray mask structure as in claim 1, further comprising a window through the substrate to define a region of the first and second inorganic layers not underlain by the substrate.

6. In a method for making an X-ray mask, the steps comprising:

forming a first intermediate amorphous inorganic layer over a substrate;

forming a first SiC layer over said first amorphous layer, so that the first amorphous layer breaks the epitaxy between the substrate and the first SiC layer;

forming a second intermediate amorphous inorganic layer over said first SiC layer;

forming a second SiC layer over said second amorphous layer, the second amorphous layer breaking the epitaxy between the first SiC layer and the second SiC layer;

forming a layer of X-ray absorbing material over said second SiC layer; and patterning said layer of X-ray absorbing material.

7. In a method as in claim 6, wherein said steps of forming said first and second SiC layers and said first and second amorphous layers are performed by chemical vapor deposition.

8. In a method as in claim 6, the further steps comprising:

masking said substrate with a mask to define a first pattern; and etching the substrate in regions not covered by said mask.

* * * * *